United States Patent [19]

McNeilly

[11] 4,001,683

[45] Jan. 4, 1977

[54] AUTOMATIC RANGE SELECTOR

[75] Inventor: Clyde E. McNeilly, Diamond Bar, Calif.

[73] Assignee: The United States of America as represented by the United States Energy Research and Development Administration, Washington, D.C.

[22] Filed: Apr. 25, 1975

[21] Appl. No.: 571,878

[52] U.S. Cl. .............................................. 324/115
[51] Int. Cl.² ...................................... G01R 15/08
[58] Field of Search .................................... 324/115

[56] References Cited

UNITED STATES PATENTS

| | | | |
|---|---|---|---|
| 2,973,238 | 2/1961 | Herzog | 346/32 |
| 3,016,488 | 1/1962 | Smith et al. | 324/115 |
| 3,317,834 | 5/1967 | Vitkus | 324/115 |
| 3,399,349 | 8/1968 | Davis | 324/115 |
| 3,536,998 | 10/1970 | Nordholm | 324/62 |
| 3,577,076 | 5/1971 | Fushour et al. | 324/115 |

Primary Examiner—R. V. Rolinec
Assistant Examiner—Vincent J. Sunderdick
Attorney, Agent, or Firm—Dean E. Carlson; Arthur A. Churm; Paul A. Gottlieb

[57] ABSTRACT

A device is provided for automatically selecting from a plurality of ranges of a scale of values to which a meter may be made responsive, that range which encompasses the value of an unknown parameter. A meter relay indicates whether the unknown is of greater or lesser value than the range to which the meter is then responsive. The rotatable part of a stepping relay is rotated in one direction or the other in response to the indication from the meter relay. Various positions of the rotatable part are associated with particular scales. Switching means are sensitive to the position of the rotatable part to couple the associated range to the meter.

6 Claims, 3 Drawing Figures

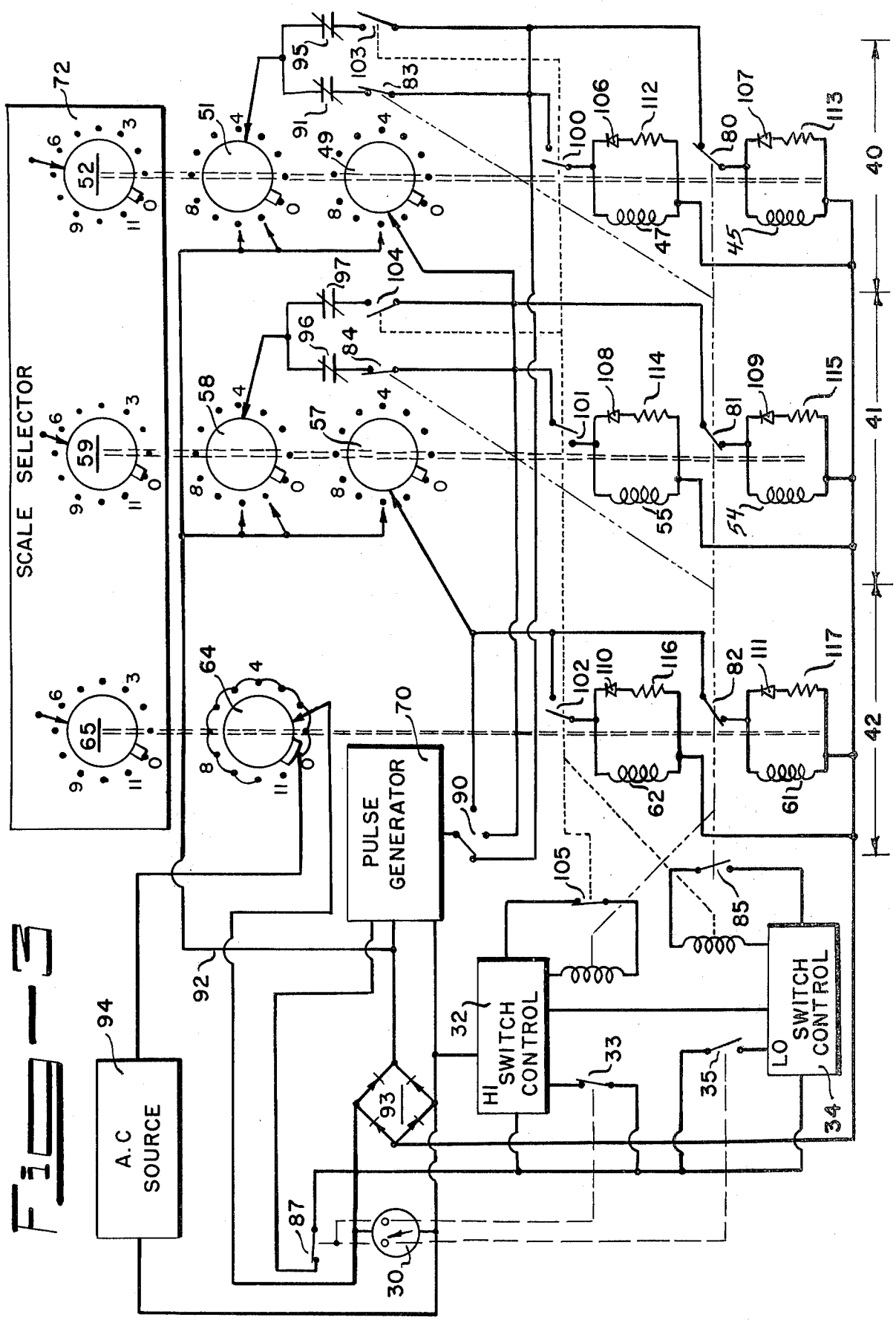

4,001,683

AUTOMATIC RANGE SELECTOR

CONTRACTUAL ORIGIN OF THE INVENTION

The invention described herein was made in the course of, or under, a contract with the UNITED STATES ATOMIC ENERGY COMMISSION.

BACKGROUND OF THE INVENTION

A meter has a scale of possible values to which it is responsive. This scale is established by the construction of the meter. Generally, for increased accuracy, the total scale of response is divided into ranges to which, by manipulation of switching mechanisms associated with the meter, the full scale deflection of the meter is limited at any one instance. For example, the meter may have a scale of 0–10, and ranges of 0–1, 1–2, 2–3, etc. The range to which the meter is responsive is determined by the manipulation of the switching mechanisms of the meter and is usually done manually.

Situations are frequently encountered where it is necessary to measure with the meter some experimental parameter over long periods of time. If the parameter changes by a few orders of magnitude during that time, but it is still desired to analyze relatively small changes in the value of the parameter, then it is necessary to provide some means for switching between the scales of the meter to encompass all possible values of the parameter. With a meter requiring manual switching between scales, continuous observation over the time period involved is necessary. Avoidance of continuous observation may be achieved by choosing a full scale deflection which covers the entire expected change. In this case small effects will probably be lost due to the inability to finely select a full scale deflection. Another method would be to use a recorder with a logarithmic response. Unfortunately, this also may compress the effects at larger values. Ideally one should be able to have an expanded scale of response with multiple ranges with turning of a switch. A full scale deflection is added or subtracted each time the instrument goes off scale until the scale encompassing the unknown is reached.

It is therefore an object of this invention to provide a means for automatically selecting from a plurality of ranges of a scale of values the range to which a meter will be responsive.

SUMMARY OF THE INVENTION

A meter mechanism normally includes a plurality of ranges of values to which the meter mechanism will be responsive at any particular time. A device is provided for automatically selecting that range from the plurality of ranges which at any instant encompasses the unknown value. A meter relay monitors the meter and indicates when the unknown is outside the range to which the meter is then being responsive. The meter can either be of range less than the unknown or greater than the value of the unknown. A stepping relay is responsive to the signal from the meter relay to cause the rotatable portion of the stepping relay to rotate in one direction or the other depending upon whether the unknown is greater than or less than the range to which the meter is then being responsive. Associated with the positions of the rotatable portion are each of the ranges. Switching means are responsive to the position of the rotatable part of the stepping relay to couple the associated range to the meter. An increased number of scales over the number of positions normally found in the stepping relay may be handled by providing cascaded stepping relays with the number of cascades relays giving the desired number of positions for the number of ranges available.

DESCRIPTION OF THE DRAWINGS

FIG. 3 is a schematic diagram of the automatic range selector.

DETAILED DESCRIPTION OF THE PREFERRED EMBODIMENT

Figure 1:
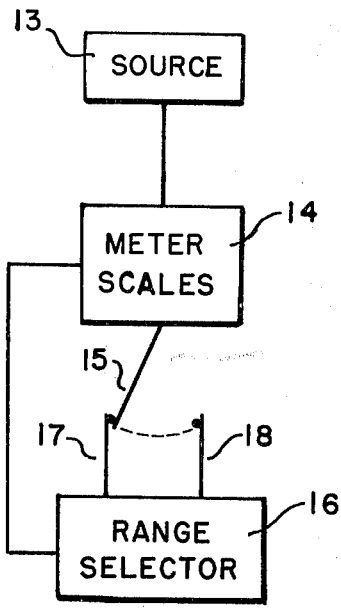
FIG. 1 is a block diagram of one embodiment using the automatic range selector.

An automatic range selector (ARS) is provided for selecting from a group of possible ranges that range which encompasses a particular unknown signal. Generally, this may be done in two ways, illustrated in FIGS. 1 and 2. In FIG. 1 an unknown signal is developed by source 13 and is applied to meter 14. Meter 14 indicates by means of pointer 15 the value of the unknown signal with respect to the particular range to which the meter is then responsive. The internal mechanism of meter 14 includes means for selecting this range from a plurality of ranges to which the meter may be made responsive. For great accuracy, the meter may be provided with a plurality of ranges of uniform successive value, 0 to 1, 1 to 2, 2 to 3, etc. It is necessary to provide a means for selecting the particular range which encompasses the value of the unknown signal developed by source 13. This is the function of the automatic range selector 16 which automaticaly and continuously keeps the value of the unknown signal within full scale deflection of meter 14. The ARS 16 senses when the pointer 15 has either gone off scale on the high end 17 or the low end 18 and develops a corresponding indication to which the internal mechanism of meter 14 is responsive to select the appropriate range to which meter 14 will be responsive.

For example, if the range to which the meter is responsive is 1–2 and pointer 15 goes off scale on the high side, ARS 16 will indicate to the internal mechanism of meter 14 that the meter should be switched to the 2–3 range, and so on, until the meter is back on scale. If pointer 15 goes off on the low side, the meter would be switched to the 0–1 range.

Figure 2:
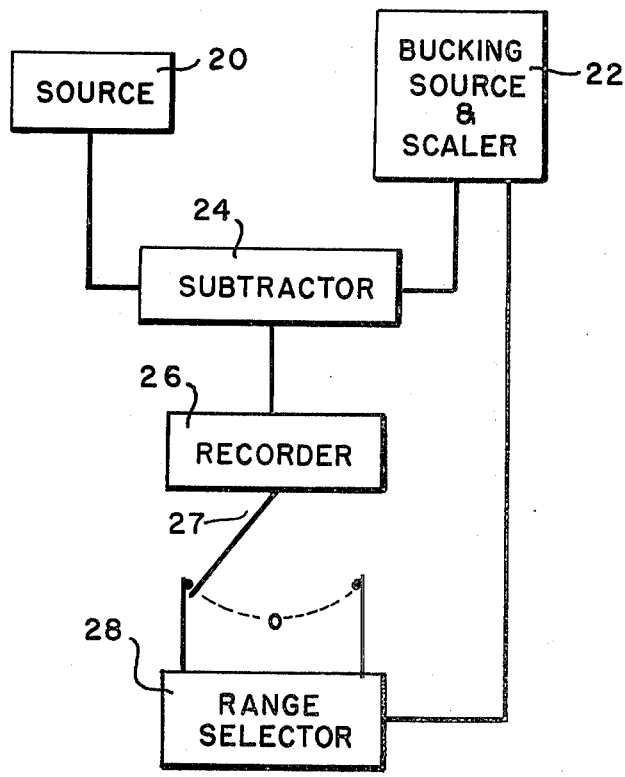
FIG. 2 is another embodiment using the automatic range selector.

Another embodiment utilizing the ARS is shown in FIG. 2. In this case the unknown signal is developed by source 20 and is compared with a bucking voltage developed by bucking source 22. The bucking source 22 has a plurality of possible outputs with one selected by switching means associated with bucking source 22. The signals are subtracted from each other by subtractor 24. The resulting signal is then applied to a recorder 26 which will indicate with pointer 27 the value of the subtraction, with 0 the center point. Whenever pointer 27 strays from 0 a particular amount either positively or negatively ARS 28 causes the switching of source 22 to select the next higher or lower bucking voltage which is then applied to subtractor 26.

Referring to FIG. 3 there is shown the automatic range selector. It includes a meter relay 30 which senses when the indicator or pointer has gone off scale, and whether it has gone off high or low, or positive or negative, and develops a corresponding signal. Preferably, meter relay 30 should be noncontactless such as of the photo cell, light combination type. Consider the case where the meter relay is sensing the high or low off scale condition. The high and low signals developed by relay 30 are applied to a high switch control 32 and a low switch control 34 respectively. Whenever either is developed the corresponding switch control operates various switches to direct the operation of the cascaded series of stepping relays 40, 41 and 42.

Stepping relay 40 includes a forward stepping motor 45, a reverse stepping motor 47, switch decks 49, 51 and 52, all mounted on a single shaft and coupled together. The stepping motors, when energized, cause the elements mounted on the shaft to rotate in the direction in which the motor rotates. This will either be forward or reverse, according to whether the motor energized is a forward or reverse motor. Stepping motors will rotate a predetermined amount with a voltage applied to them. By applying pulses to the stepping motors, the motors can be made to rotate in small predetermined segments. With a too long a pulse the motor may move through two segments. The number of segments, which is built in is a particular number for each 360° of rotation of the stepping relay. Similarly, the other stepping relays 41 and 42 include combinations of motors and switch decks. Stepping relay 41 includes forward stepping motor 54, reverse stepping motor 55, switch decks 57, 58 and 59 all mounted on a shaft and coupled together and operating as described for stepping relay 40. Stepping relay 42 includes forward stepping motor 61, reverse stepping motor 62, and switch decks 64 and 65 all mounted on the same shaft and coupled together. In the embodiment shown in FIG. 3 there are 12 positions for each relay 40, 41, 42 denoted by the numerals 0 through 11. Pulses are applied to the stepping motors by pulse generator 70 and the motor have a built in 12 segments per 360° of rotation of stepping relays 40, 41 and 42 when the pulses are applied to the forward and reverse stepping motors of each relay.

The stepping relays 40, 41 and 42 are interconnected to form a cascaded series as will be more particularly described. A cascaded series is one in which a first stage controls operation of a second stage, the second stage controls operation of a third stage and so on. Each stage can be said to control operation of the next adjacent higher stage. The switch decks which rotate about the shafts of each stepping relay indicate the particular position of each stepping relay. Associated with each combination of positions is a particular range of the meter. Scale selector 72 is responsive to the particular position of each stepping relay to couple the range associated with that position to the meter. Where ranges are part of the meter as might be found in the embodiment of FIG. 1, the switching between scales is controlled by an internal mechanism which is designed to be manually operated by turning knobs to make various different connections. The internal mechanism of the meter is responsive to the various combinations of positions to select the desired range and make the meter responsive thereto. For that type of device the automatic range selector herein disclosed, merely replaces the knobs of such a meter. Thus switch decks 52, 59 and 65 make various combinations of connections to which scale selector 72 is responsive to select the desired range. For the embodiment illustrated in FIG. 2, the output of bucking source 22 could be established by using the stepping switches 52, 59 and 65 as voltage dividers to supply the bucking voltage. Each combination of positions of stepping relays 40, 41 and 42 would correspond to different resistances. A voltage applied across these resistances would vary with the position of switches 52, 59 and 65. Scale selector 72 would then include the voltage source and connections to the various positions of switches 52, 59 and 65 to establish a voltage divider drain. Such a voltage divider scale selector is shown in U.S. Pat. No. 2,865,000 entitled "Automatic Volt-Ohmeter".

In operation meter relay 30 develops either a high signal which is applied to switch control 32 or a low signal which is applied to switch control 34. It is best to set meter relay 30 to develop these signals at 2% away from the high or low end point to avoid unnecessary oscillation of the device when it is near full scale deflection. Consider the example where a high signal is developed and a high signal is applied to switch control 32. Switch control 32 then causes switches 80, 81, 82, 83 and 84 to close thereby enabling only forward stepping motors 45, 54 and 61 to receive pulses from pulse generator 70 and opens switch 85 to prevent both switch controls from being at the same time. Simultaneous with the development of the high signal, pulse generator 70 is actuated by operation of switch 87. It is best if pulse generator 70 delays developing pulses after it is activated because switching transients can cause the meter to go off scale momentarily. The delay allows the meter to reach equilibrium. Note that when the high or low signal ends because the meter is on scale the meter and the switch controls are inactivated. Switch 90, which has previously been set, determines which stepping relay will receive initial pulses. This is a function of the number of ranges of the meter since stepping relays 40, 41, 42 are cascaded and act like a counter with relay 40 the units, relay 41 the tens and relay 42 the hundreds. In this embodiment switch 90 is set so that relay 40's motors will receive the pulses from generator 70.

After the time delay, pulse generator 70 applies pulses to forward stepping motor 45 through switch 80. In response to this pulse the forward stepping motor 45 causes step relay 40 to rotate one position in the forward direction. Thus, all the motors and switch decks mounted on the shaft for stepping relay 40 also move ahead one position. Scale selector 72 responds to this change in position of one unit by switch deck 52 to couple the next highest range to the meter. If the stepping relay is in position 9 and a high pulse is received, according to the embodiment shown in FIG. 3 where the stepping relay counts only to 10, it is necessary that stepping relay 41 also advance one position to the next tens position. This is accomplished by first requiring that each switch control 32 and 34 be time delay activated on shut off. This means that after the high signal ends there is still control exercised by switch control 32 to allow for the cascading to continue. Thus switches 80, 81, 82, 83, and 84 remain closed for this time delay. When the pulse developed by pulse relay 70 ends due to a switching of scales, the stepping relay 40 is in position 10. The forward stepping motor 45 now receives power through switch deck 51 and the built-in interrupter switch 91. A DC signal is available through lead 92. It is developed by rectifier 93 operating on the AC signal developed by AC source 94. An interrupter switch will guarantee that a DC voltage applied to a stepping motor will be limited in duration to that necessary to move the stepping motor only one position. Interrupter switches 95, 96 and 97 perform the same function for the other motors. Thus, this causes the stepping motor 45 to drive the stepping relay 40 to position 11 where it receives an additional pulse through switch 51 and so steps onto the 0 position. As the switch steps through position 10, switch deck 49 gives a pulse to the next forward stepper motor 54 of stepping relay 41 through switch 81. Decks 57 and 58 perform the same function in driving stepping relay 42 so that counting from 099 to 100 can be accomplished. Switch deck 64 is wired as a make before break switch so that if the counter goes beyond the total response of the meter and switch 64 is in position 11, the power to the instrument is shut off.

Note that the stepping relays shown all have 12 positions since that is the number of positions usually found in stepping relays. Any number is satisfactory. Also, a tens counting system was used. This is not crucial. To achieve a tens count an extra pulse connection at positions 10 and 11 was given decks 51 and 58. If an elevens counting system were used only one such position would be needed.

When the meter goes off scale on the low end, and the low signal is developed, the operation is essentially the same except that switch control 34 now enables the reverse stepping motors of each stepping relay by closing switches 100, 101, 102, 103, 104 and opening 105. Pulses developed by pulse generator 70 will drive the appropriate stepping motor which will reverse rotate the stepping relay. The scale selector 72 will remain responsive to the position of the stepping relays and will likewise reduce the scale to which the meter is then responsive. Borrowing from 0 to 9 position follows as for the forward carry from 9 to 0.

Because of the high inductance of the stepping motors, diodes 106, 107, 108, 109, 110 and 111 are required for arc suppression. Resistors 112, 113, 114, 115, 116 and 117 merely limit the current through the diodes and help keep the diodes from reducing the stepping motor speed too much. Note that the number of stages and the number of positions per stage of stepping relays is a matter of choice and in this case has been described to be 10 positions and three cascades in order to conform to the general switching characteristics of meters. Of course to those skilled in the art greater cascades or different number of positions per cascade would be apparent. The make-before break-contact nature of switch deck 64 is utilized only to provide a means for shutting off the device if the unknown extends beyond the range of the meter as controlled by the automatic range selector. If the experiment is certain to be within the range of the meter, this protection may be omitted and switch deck 64 can be wired similarly to the other switch decks.

The embodiments of the invention in which an exclusive property or privilege is claimed are defined as follows:

1. In a meter mechanism for indicating the value of an unknown parameter applied thereto, the mechanism including a scale with a plurality of ranges of values to which the meter mechanism can be made responsive at a particular instant, a range selector for developing an indication of the particular range of the scale which encompasses the value of the unknown parameter, and a scale selector coupled to the scale and the range selector and being responsive to the indication of the range selector to select the particular range of the scale and to make the meter mechanism responsive thereto, the improvement in the range selector, comprising: a meter relay coupled to said meter mechanism and being responsive to the value of the unknown parameter being outside the range to which the meter mechanism is then responsive to develop a high signal with the value of the unknown parameter of greater value and a low signal with the value of the unknown parameter of lesser value, and a plurality of stepping relays coupled in series to form a cascaded series of N relays, where N is an integer, said cascaded series being arranged in sequence from the first through the Nth relay, each of said N relays having a rotating portion with a number of contact positions, each combination of positions of all of the rotating portions of said stepping relays having associated therewith one of said ranges so that rotation of said rotating portion of any of said relays from one contact position to an adjacent contact position in one direction corresponds to ranges of increasing value and in the other direction corresponds to ranges of decreasing value, one of the contact positions of the first through said (N-1)th relays being a transfer position and said relays being so coupled to each other that with rotation of one of said rotating portions to the transfer position thereof in said one direction causes the rotating portion of the adjacent relay next higher in order in the order from said first through Nth relay to rotate to the next contact position thereof in said one direction and with rotation of one of said rotating portions to the transfer position thereof in said other direction causes the rotating portion of the adjacent relay next lower in order in the order from said first through Nth relay to rotate to the next contact position thereof in said other direction, a relay of said cascaded series being coupled to said meter relay and the scale selector and being responsive to said high signal to rotate the rotating portion thereof in said one direction to the next adjacent contact position and being responsive to said low signal to rotate the rotating portion in said other direction to the next adjacent contact position, the scale selector being responsive to the contact position of said rotating portion to make the meter mechanism responsive to the range associated with the combination of contact positions of said rotating portions.

2. The meter mechanism of claim 1 further including a power source for developing a power output, and wherein each of the first through (N-1)th relay's rotating portions have a coupling switch deck, and a transfer switch deck, with one of the first through (N-1)th relays rotated in a particular direction to said one relay's transfer point, said one relay being coupled to said power source by said coupling switch deck, and said one relay being responsive to said power output to cause said one relay's rotating portion to rotate in said particular direction to said one relay's next contact position and to couple via said one relay's transfer deck the relay of said sequence next in order to said one relay in the order from said first through Nth relay to said power source, said next relay being responsive to said power output to cause the rotating portion of said next relay to rotate in said particular direction to said next relay's next contact point.

3. The meter mechanism of claim 1 wherein each rotating portion includes a forward and a reverse stepping motor, and wherein said meter relay includes high and low switch controls, said high switch control coupled to said power source and a particular relay and being responsive to said high signal to couple said power source to the forward stepping motor of said particular stepping relay, said forward motor of said particular relay being responsive to said power output to rotate forward one position, said low switch control coupled to said power source and said particular relay and being responsive to said low signal to couple said power source to the reverse stepping motor of said particular relay, said reverse motor of said particular relay being responsive to said power output to rotate reverse one position, with said one of said first through (N-1)th relays rotated in said particular direction to said one relay's transfer point said coupling switch deck couples said power source to the stepping motor of said one relay which in response to said power output causes rotation in said particular direction and said transfer switch deck couples said power source to the stepping motor of said next relay which in response to said power output causes rotation in said particular direction.

4. The meter mechanism of claim 3 wherein said power source includes a pulse generator for developing pulses, said high switch control being responsive to said high signals to couple said pulse generator to the forward stepping motor of said particular stepping relay, and said low switch control being responsive to said low signal to couple said pulse generator to the reverse stepping motor of said particular stepping relay, the motors of said particular relay being responsive to said pulses to advance the rotating portion thereof one position.

5. The meter mechanism of claim 4 wherein said power source includes a DC power supply developing a DC output and said stepping relays include interrupter switches, with said one relay at said one relay's transfer point said coupling switch deck of said one relay coupling said DC power supply through the interrupter switch of said one relay to the stepping motor of said one relay which causes rotating one position in said particular direction and said transfer switch deck of said one relay coupling said DC power supply to the stepping motor of said next relay through the interrupter switch of said one relay which causes rotating one position in said particular direction.

6. The meter mechanism of claim 5 wherein said Nth stepping relay includes a make before break switch deck having a number of contact points serially coupled and a stop point and being coupled to said power source so that said power output is developed with said make before break switch deck at one of the contact points of said Nth relay and said power output is terminated with said make before break switch deck at said stop point.

* * * * *